US008914688B2

(12) United States Patent
Belansek et al.

(10) Patent No.: US 8,914,688 B2
(45) Date of Patent: Dec. 16, 2014

(54) SYSTEM AND METHOD OF REDUCING TEST TIME VIA ADDRESS AWARE BIST CIRCUITRY

(71) Applicant: International Business Machines Corporation, Armonk, NY (US)

(72) Inventors: George M. Belansek, Milton, VT (US); Kevin W. Gorman, Fairfax, VT (US); Kiran K. Narayan, Bangalore (IN); Krishnendu Mondal, Bangalore (IN); Michael R. Ouellette, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 115 days.

(21) Appl. No.: 13/685,779

(22) Filed: Nov. 27, 2012

(65) Prior Publication Data

US 2014/0149810 A1     May 29, 2014

(51) Int. Cl.
*G11C 29/00* (2006.01)
*G11C 29/20* (2006.01)

(52) U.S. Cl.
CPC ............................ *G11C 29/20* (2013.01)
USPC ..................... 714/720; 714/734; 714/710

(58) Field of Classification Search
CPC ................................ G11C 29/10; G11C 29/56
USPC .................... 714/720, 733, 734, 710, 711, 41
See application file for complete search history.

(56) References Cited

U.S. PATENT DOCUMENTS

| | | | |
|---|---|---|---|
| 5,930,814 A | 7/1999 | Lepejian et al. | |
| 5,974,579 A | 10/1999 | Lepejian et al. | |
| 6,360,342 B1 | 3/2002 | Lee et al. | |
| 6,658,610 B1 | 12/2003 | Chai et al. | |
| 6,909,624 B2 | 6/2005 | Sadakata et al. | |
| 7,010,736 B1 | 3/2006 | Teh et al. | |
| 7,278,078 B2 | 10/2007 | Hii et al. | |
| 7,734,975 B2 | 6/2010 | Anzou et al. | |
| 7,757,141 B2 | 7/2010 | Chickanosky et al. | |
| 2008/0098269 A1 | 4/2008 | Bhavsar et al. | |
| 2011/0209012 A1 | 8/2011 | Tiwary et al. | |

*Primary Examiner* — Fritz Alphonse
(74) *Attorney, Agent, or Firm* — Gibb & Riley, LLC; David A. Cain, Esq.

(57) ABSTRACT

In a method of executing a BIST operation on IC memory arrays having a common BIST control unit, a first BIST sequence is initiated. Each address for the arrays is incremented. The BIST control unit receives a signal indicating a maximum valid address in the array is reached, receiving a plurality of maximum valid addresses, which are recorded. A single relatively highest maximum valid address is determined. A first mode, which prevents BIST testing, is engaged in each array having reached the maximum valid address. A second BIST sequence is initiated based on having received the signal indicating a maximum valid address is reached from all the arrays connected to the common BIST control unit. An address count is decremented from the single relatively highest maximum valid address. The first mode is disengaged for each array as the address count reaches each of the maximum valid addresses during the decrementing.

25 Claims, 13 Drawing Sheets

SYSTEM AND METHOD OF REDUCING TEST TIME VIA ADDRESS AWARE BIST CIRCUITRY

BACKGROUND

The present disclosure relates to built-in self-test (BIST) devices and methods, and more specifically, to structures and methods that reduce the time for testing memory arrays connected to a common BIST controller.

Silicon chips are being populated with increasing amounts of memory and logic as technologies progress. Power demand due to simultaneous use of these memories can cause disturbances to the power supply. These voltage disturbances can cause memories or logic to fail due to operation outside of the rated voltage range.

As more memories are integrated onto chips and the power density of those chips increases (increasing watts per square mm) the risk that simultaneous access of memories will cause logic or memory failures increases greatly. Typical chip function will operate a subset of memory content at any one point in time in order to manage power consumption. Power supply decoupling capacitance can be added to chip and board designs to mitigate transient voltage disturbances and larger power supplies and/or improved cooling mechanisms can be applied to support higher power usage in general, but all of these solutions are expensive in terms of chip area and system cost.

Memory BIST (built-in self-test) is an important tool for testing memories (including finding/diagnosing and repairing defects within those memories). As more memory is integrated into chips thorough BIST test and repair is a requirement in order to ensure reasonable product quality/reliability levels. To improve BIST quality oftentimes more test patterns are run as part of manufacturing test. Total test time can take many millions of cycles when all necessary test patterns are included.

Memory BIST is designed to operate as many memories as possible simultaneously, while still avoiding false failures due to over test (due to exceeding the power specification for a certain chip design). For a given chip design, this might be a small subset, whereas for other chip designs this could include virtually all memories. In addition, memory BIST should be able to test with some margin compared to the normal functional application in order to produce good SPQL (shipped product quality level) while minimizing impacts to yield.

High quality memory test and repair via extremely thorough test needs to be balanced against test time. Test time can be a major cost component of chips (sometimes reaching into the multi-minute range). Anything that can be done to reduce test time is valuable.

In an ASIC chip design system an automated methodology for inserting memory BIST and generating manufacturing test patterns is needed in order to produce an economical method for providing test infrastructure. However, most automated methods that use a single BIST engine to test multiple memory instances simply program the BIST to test the largest possible memory. This is the easiest method for performing the test. When the BIST enters an out of bounds region of the address space test logic specific to each memory (specific to each memory's address space size) will convert the BIST operations to write operations to non-existent addresses (when aliasing is not possible) or to read operations (where the results are simply ignored). This "out of bounds" detection logic is common practice.

Some test insertion methods use either hardware based or software based programming to attempt to shrink the address space/reduce test time. For hardware-based programming, an inventory of all memories attached to a BIST must be taken and the maximum address of the BIST adjusted. This is done prior to logic synthesis. For software-based programming, an inventory of all memories attached to a BIST must be taken and the maximum address of the BIST adjusted (programmed via override logic that can take a large amount of chip area). Either method is complicated and difficult to implement and verify. The consequence of not adjusting the maximum address space of the BIST correctly would be un-tested regions of memories (which could be disastrous from a quality standpoint).

Consequently, a robust (low risk) mechanism for adjusting the BIST address space dynamically using existing test structures (with minimal additional area overhead) would be highly desired to reduce test time/cost.

SUMMARY

This disclosure describes how the execution of each BIST domain and/or each BIST within a BIST domain can be dynamically modified to reduce test time by limiting the address space under test to only the address space used by the memories associated with each BIST domain or BIST within a BIST domain. Furthermore, test modes are described herein that allow for adjusting the BIST test to test with margin to final chip functional application while still performing memory test in as parallel a fashion as possible in order to reduce test time (i.e. test cost).

According to one embodiment herein, a method is disclosed. According to the method, a first built-in self-test (BIST) sequence is initiated on a plurality of integrated circuit memory arrays having a common BIST control unit. Each address for each integrated circuit memory array is incremented in common from a common starting point, using the common BIST control unit. The common BIST control unit receives from each integrated circuit memory array a signal indicating a maximum valid address in the integrated circuit memory array is reached, to receive a plurality of maximum valid addresses. The maximum valid addresses are recorded in the common BIST control unit. A single relatively highest maximum valid address is determined from the plurality of maximum valid addresses, using the common BIST control unit. The common BIST control unit engages a first mode in each integrated circuit memory array having reached the maximum valid address. The first mode prevents BIST testing. A second BIST sequence is initiated from the common BIST control unit on the plurality of integrated circuit memory arrays having the common BIST control unit based on the common BIST control unit having received the signal indicating a maximum valid address in the integrated circuit memory array is reached from all the integrated circuit memory arrays connected to the common BIST control unit. An address count is decremented from the single relatively highest maximum valid address, using the common BIST control unit. The common BIST control unit disengages the first mode for each integrated circuit memory array as the address count reaches each of the maximum valid addresses of each of the integrated circuit memory arrays during the decrementing.

According to another embodiment herein, a computer implemented method of executing a built-in self-test (BIST) operation on a plurality of integrated circuit memory arrays having a common BIST control unit is disclosed. According to the method, a first BIST sequence is initiated on the plurality of integrated circuit memory arrays, using a computerized device. Starting from a common starting point, each address for each integrated circuit memory array is automatically incremented in common from the common starting point, using the computerized device. The computerized device receives a signal from each integrated circuit memory array indicating a maximum valid address has been reached. The computerized device receives a plurality of maximum valid addresses. The maximum valid address for each of the integrated circuit memory arrays is recorded, using the computerized device. A single relatively highest maximum valid address is determined from the plurality of maximum valid addresses, using the computerized device. A first mode is engaged in each integrated circuit memory array having reached the maximum valid address, using the computerized device. The first mode prevents BIST testing. The computerized device initiates a second BIST sequence on the plurality of integrated circuit memory arrays based on the signal indicating the maximum valid address in the integrated circuit memory array has been received from all the integrated circuit memory arrays connected to the common BIST control unit. Starting from the single relatively highest maximum valid address, the computerized device decrements an address count for each integrated circuit memory array. The first mode is disengaged for each integrated circuit memory array as the address count passes the maximum valid address associated with each integrated circuit memory array during the decrementing, using the computerized device.

According to another embodiment herein, an apparatus for executing a built-in self-test (BIST) on integrated circuit memory arrays is disclosed. A BIST control unit comprises a test pattern generator, an address counter, and a plurality of memory storage elements. The BIST control unit is operatively coupled to a plurality of integrated circuit memory arrays. Each integrated circuit memory array comprises sensing logic for comparing a received address to a maximum valid address for the integrated circuit memory array, and a signal generator generating a signal based on the maximum valid address being reached. The BIST control unit generates and transmits a first test pattern to each integrated circuit memory array. The BIST control unit sequentially increments or decrements the address counter, and generates and transmits another test pattern to each integrated circuit memory array. The BIST control unit receives the signal indicating the maximum valid address has been reached for each integrated circuit memory array. The BIST control unit stores the maximum valid address for each of the integrated circuit memory arrays in one of the plurality of memory storage elements. The BIST control unit determines that all the integrated circuit memory arrays have indicated that the maximum valid address has been reached.

According to another embodiment herein, a computer program product for executing a built-in self-test (BIST) operation is disclosed. The computer program product comprises a computer readable storage medium having program code embodied therewith. The program code is readable and executable by a computer to perform a method. According to the method, a first built-in self-test (BIST) sequence is initiated on a plurality of integrated circuit memory arrays having a common BIST control unit. Each address for each integrated circuit memory array is incremented in common from a common starting point. A signal is received from each integrated circuit memory array indicating a maximum valid address in the integrated circuit memory array is reached, to receive a plurality of maximum valid addresses. The maximum valid addresses are recorded. A single relatively highest maximum valid address is determined from the plurality of maximum valid addresses. A first mode is engaged in each integrated circuit memory array having reached the maximum valid address. The first mode prevents BIST testing. A second BIST sequence is initiated on the plurality of integrated circuit memory arrays having the common BIST control unit based on having received the signal indicating a maximum valid address in the integrated circuit memory array is reached from all the integrated circuit memory arrays connected to the common BIST control unit. An address count is decremented from the single relatively highest maximum valid address. The first mode is disengaged for each integrated circuit memory array as the address count reaches each of the maximum valid addresses of each of the integrated circuit memory arrays during the decrementing.

BRIEF DESCRIPTION OF THE DRAWINGS

The embodiments herein will be better understood from the following detailed description with reference to the drawings, which are not necessarily drawn to scale and in which.

DETAILED DESCRIPTION

It will be readily understood that the embodiments of the present disclosure, as generally described and illustrated in the figures herein, may be arranged and designed in a wide variety of different configurations in addition to the embodiments described herein. Thus, the following detailed description of the embodiments, as represented in the figures, is not intended to limit the scope of the invention as claimed, but is merely representative of selected embodiments. The following description is intended only by way of example, and simply illustrates certain embodiments of the invention, as claimed herein.

Figure 1:
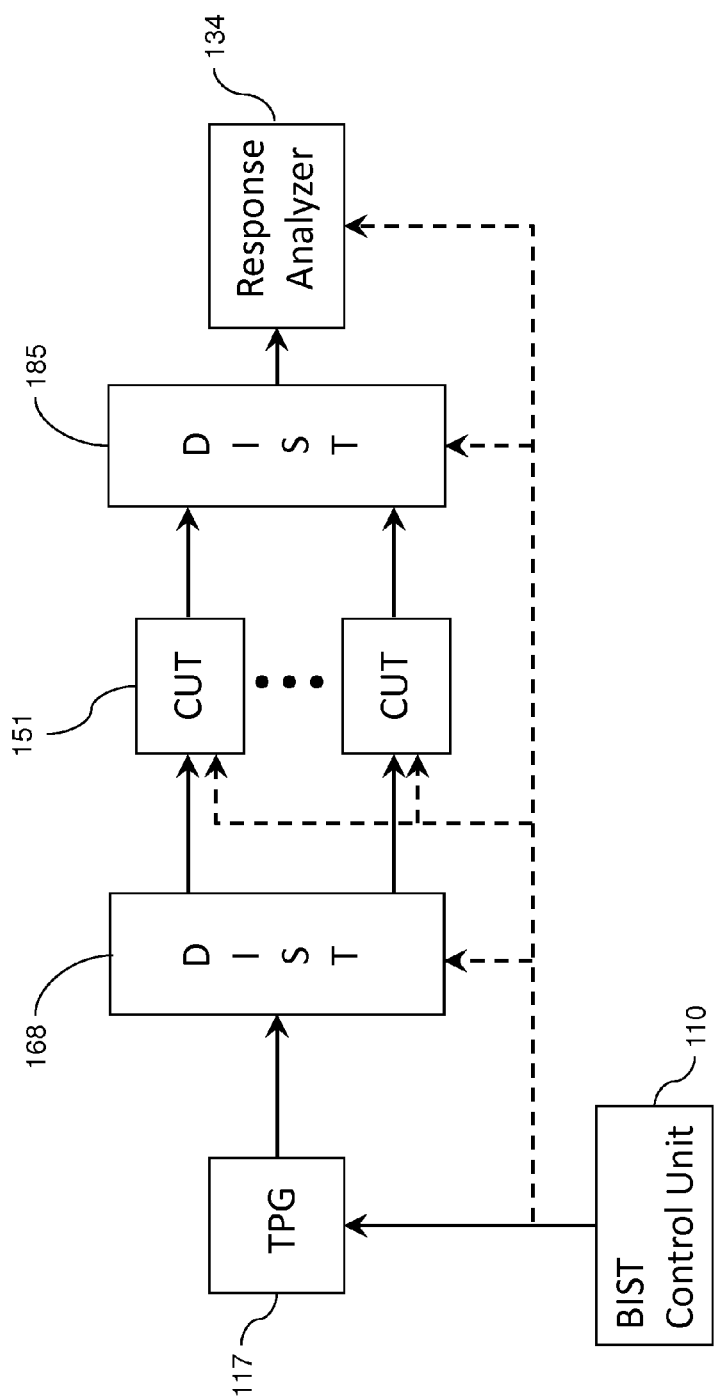
FIG. 1 is a block diagram illustrating various aspects of embodiments herein.

FIG. 1 shows a functional block diagram of BIST circuitry. The circuitry includes a BIST Control Unit 110, a test pattern generator 117, and a response analyzer 134. The test pattern generator 117 stimulates one or more circuits under test (CUT) 151 via distribution network 168. The response analyzer 134 gathers the response to the test pattern from the CUTs 151 through distribution network 185. The BIST Control Unit 110 coordinates the actions of the test circuitry.

As mentioned above, embodiments herein allow for the reduction of test time by generating only the valid address for the maximum memory configuration connected to it. Essentially the address incrementing will be stopped as soon as the maximum address of the connected memories is reached. The "out of bounds" detection logic (abbreviated AGTC) will be fed back from the test circuits specific to each memory to the common BIST. The BIST will essentially look at the sum of these signals to determine when to stop.

For decrementing, some reduction in test time can be easily achieved, but not as much as during incrementing using a basic approach. A more complicated approach (that takes more area) can realize more test time savings.

It is also advisable to have a way to defeat this mechanism. When this mechanism is enabled, different BIST engines will stop different patterns/test sequences at different times depending on what memories are attached to them. In some cases this may create a more optimistic noise profile compared to what is truly desired for worst case test, so having a way to remove this and keep the BIST engines in lock step during execution (regardless of what memories are attached) is advisable.

Figure 2:
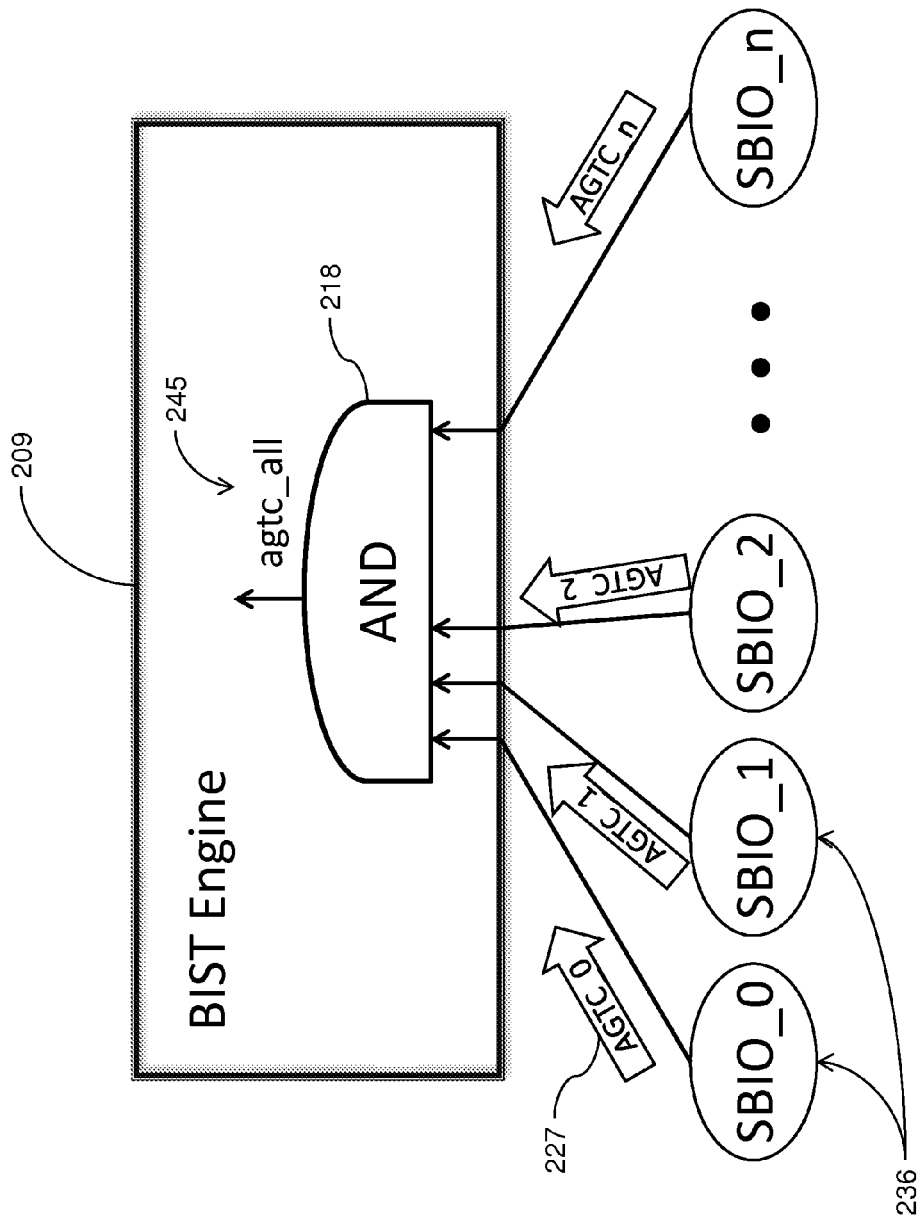
FIG. 2 is a block diagram illustrating various aspects of embodiments herein.

Referring to FIG. 2, the AGTC signals from the SBIOs (test logic local to each memory) must be passed to the BIST Engine 209. The AGTC logic already exists in each SBIO for normal pattern execution, since the SBIO needs to recognize when the BIST goes out of bounds for that specific memory instance.

As shown in FIG. 2, an AND gate 218 receives the AGTC signal 227 from each SBIO 236 (indicated as SBIO_0 through SBIO_n). The AGTC signals 227 are combined in the AND gate 218 to generate an 'agtc_all' signal 245. The BIST Engine 209 determines whether to stop address incrementing based on the agtc_all signal 245. That is, when agtc_all=0, the address should keep incrementing and when agtc_all=1, the address should stop incrementing. When the address stops incrementing, the test pattern can be truncated. This is valid for any address increment situation including when the address counters are counting from low order addresses that exist in all memories to high order addresses that may be out of bounds.

Figure 3:
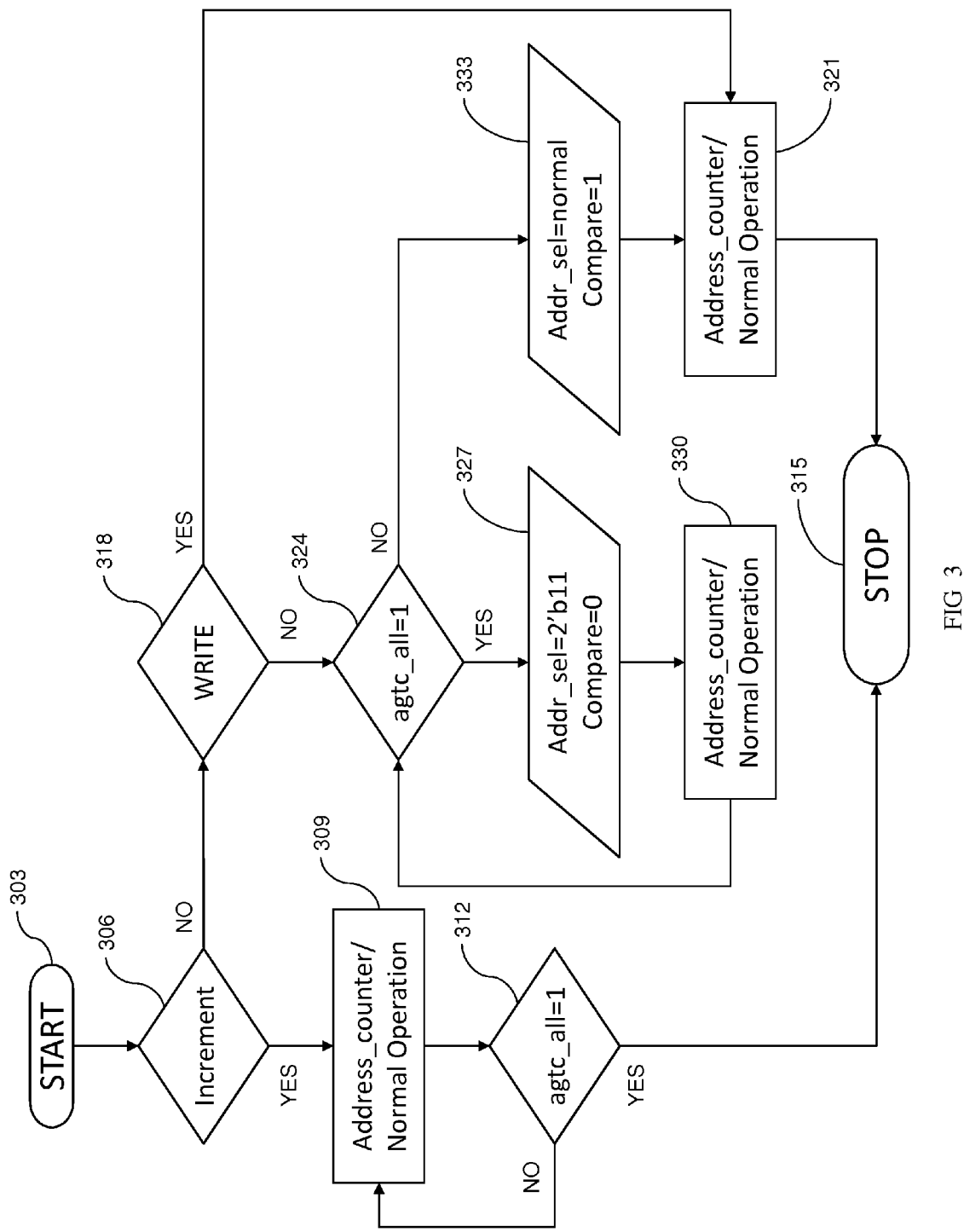
FIG. 3 is a flow diagram illustrating embodiments herein.

The flow block diagram of FIG. 3 illustrates how the AGTC signals 227 interact with the BIST Engine 209. The process starts at 303. If address incrementing is taking place, at 306, the address counter continues in normal operation, at 309. The BIST Engine 209 determines whether to stop address incrementing based on the agtc_all signal, at 312. As described above, when agtc_all=0, the address should keep incrementing and when agtc_all=1, the address should stop incrementing. When the address stops incrementing, the test stops, at 315.

For decrementing, the situation is more complicated since the address counter would naturally start at the maximum address value for a given BIST/memory type and decrement until it reaches a region where the address is valid/in range (in bounds).

For decrementing an embodiment herein performs the following:
   During write operations, indicated as 318, the address generation would remain as normal 321. That is, the agtc_all signal is ignored and there is no change to the address counter operation.
   During read operations, when the address is out of bounds (that is, agtc_all is asserted, at 324) four different read operations occur in a burst rather than a single read operation. This is performed by setting a signal to the address counter logic called "Addr_sel" to 2'b11, at 327. This reduces the cycles spent performing reads while out of bounds by approximately a factor of 4. The address counter continues in normal operation, at 330. When the address is in bounds (that is, agtc_all is 0 or de-asserted, at 324) the test operations would revert to a single read operation per burst. This is indicated by a signal to the address counter called "Addr_sel"=normal as controlled by the pattern, at 333.

This is applicable for a BIST architecture that applies operations to a memory in bursts of four, where the burst can consist of a mix of write and read operations to different addresses. In such an application, to reduce area, a valid read is allowed to occur only once in such a burst. This reduces the amount of data that needs to be stored on the chip for each burst operation. Other BIST applications can use different sized bursts. A BIST application that can perform valid read operations on every cycle would essentially have a burst size of one (and would see no real savings during decrementing).

Figure 4:
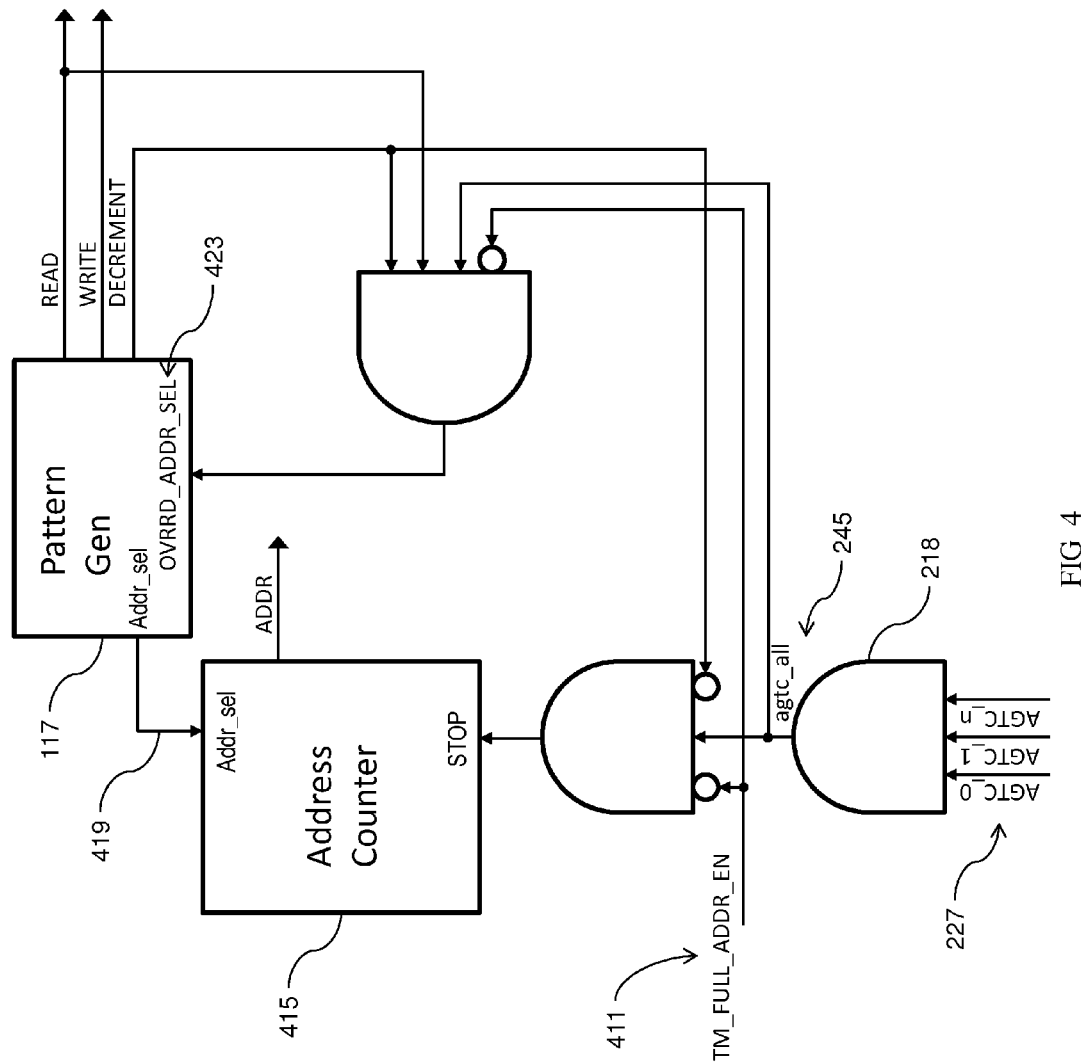
FIG. 4 is a block diagram illustrating various aspects of embodiments herein.

FIG. 4 shows a block diagram of an embodiment herein. As shown in FIG. 4, the TM_FULL_ADDR_EN 411 is used to suppress the agtc_all signal in the event that a noisy condition must be replicated when all BIST engines are running at the same time. This would prevent some BIST engines from ending the test early if they are only connected to small memories, thus making the test environment noisier for larger memories on other BIST engines. The pattern generation logic dictates when read vs. write operations occur and when incrementing/decrementing occurs. This information is used to modify how the address counter 415 operates when the agtc_all signal 245 is asserted via the logic shown. Finally, the Addr_sel bus 419 is used to modify addressing depending on details of the burst sequencing as determined by the pattern generation logic. The address selection can be overridden via the OVRRD_ADDR_SEL connection 423 based on the agtc_all signal in order to force it to a 2'b11 value, which changes the number of cycles devoted to reading as discussed above.

It is expected that this embodiment will result in the following approximation of test time savings (where n is determined by the number of operations allowed in a burst, it may vary with BIST architecture):

$$savings=(max\_addr-largest\_used\_address)*incrementing\_sweeps*(write\_ops+read\_ops)+(max\_addr-largest\_used\_address)*deccrementing\_sweeps*read\_ops*(n-1).$$

Figure 5:
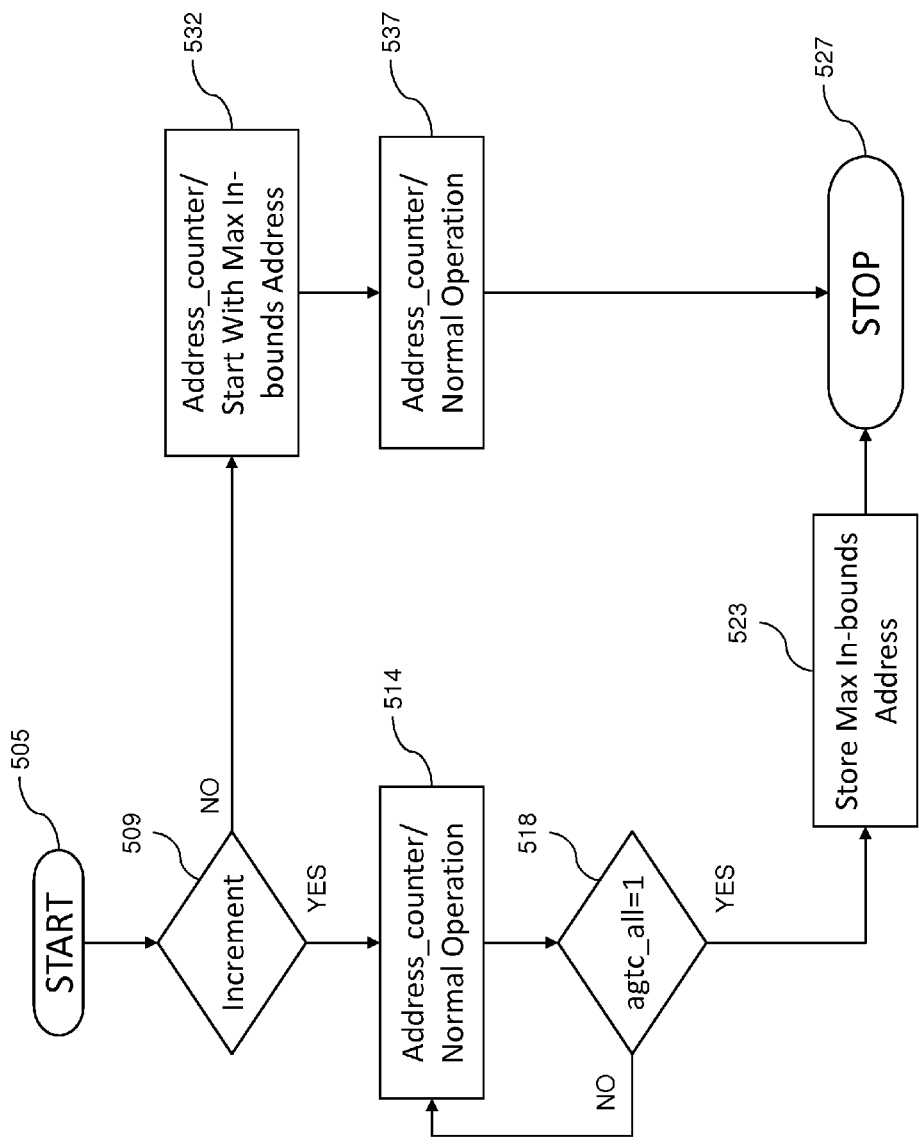
FIG. 5 is a flow diagram illustrating embodiments herein.

Referring to FIG. 5, according to a further embodiment, decrementing requires that all test patterns sequences start with an increment through the array, which is typical for BIST based memory testing. The process starts at 505. If address incrementing is taking place, at 509, the address counter continues in normal operation, at 514. The BIST Engine 209 determines whether to stop address incrementing based on the agtc_all signal, at 518. As described above, when agtc_all=0, the address should keep incrementing and when agtc_all=1, the address should stop incrementing. When incrementing 509 and agtc_all is asserted 518, the maximum address for the BIST cluster (BIST and all related memories) is then recorded, at 523. When the address stops incrementing, the test stops, at 527.

When decrementing, the address generation logic starts with the address that has been recorded (the maximum in bounds address, rather than the maximum possible address), at 532. The max address register would normally be loaded to a default value (such as the maximum allowed value for a BIST type). This can be done via a scan, a reset, or any other alternative means typically used to initialize registers. The address counter continues counting down in normal operation, at 537.

Figure 6:
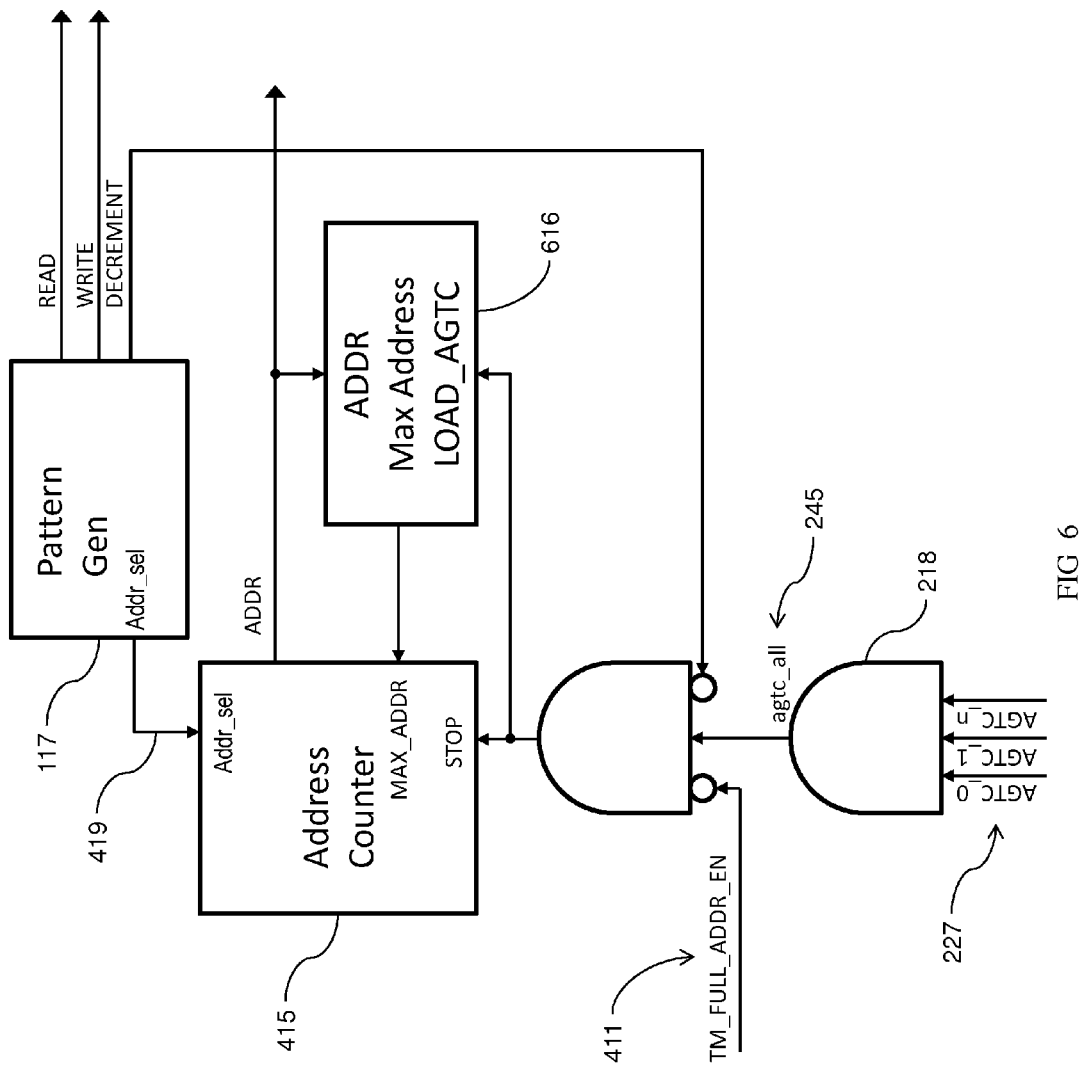
FIG. 6 is a block diagram illustrating various aspects of embodiments herein.

FIG. 6 shows a block diagram of an embodiment herein. As shown in FIG. 6, the agtc_all signal 245 provides a means of dynamically altering the maximum in bounds address value via the LOAD_AGTC path 616 based on the memories connected to the BIST.

It is expected that this embodiment will result in the following approximation of test time savings:

savings=(max_addr−largest_used_address)*incrementing_sweeps*(write_ops+read_ops)+(max_addr−largest_used_address)*deccrementing_sweeps*(write_ops+read_ops)

According to embodiments herein, a test mode would be available for turning off the agtc_all function to make all BIST engines operate identically regardless of the associated memories.

In summary, an apparatus for executing a built-in self-test (BIST) on integrated circuit memory arrays comprises a test pattern generator 117, an address counter 415, and a plurality of memory storage elements. The BIST control unit 110 is operatively coupled to a plurality of integrated circuit memory arrays. Each integrated circuit memory array comprises sensing logic (SBIO) for comparing a received address to a maximum valid address for the integrated circuit memory array, and a signal generator generating a signal based on the maximum valid address being reached. The BIST control unit 110 generates and transmits a first test pattern to each integrated circuit memory array. The BIST control unit 110 sequentially increments or decrements the address counter 415, and generates and transmits another test pattern from the test pattern generator 117 to each integrated circuit memory array. The BIST control unit 110 receives the signal indicating the maximum valid address has been reached for each integrated circuit memory array. The BIST control unit 110 records the maximum valid address for each of the integrated circuit memory arrays in one of the plurality of memory storage elements. The BIST control unit 110 determines that all the integrated circuit memory arrays have indicated that the maximum valid address has been reached. The BIST control unit 110 contains a summation circuit that receives the out of bounds signals and connects to the address counter stop logic to reduce BIST pattern length. In some embodiments, the address counter stop logic can be bypassed.

Figure 7:
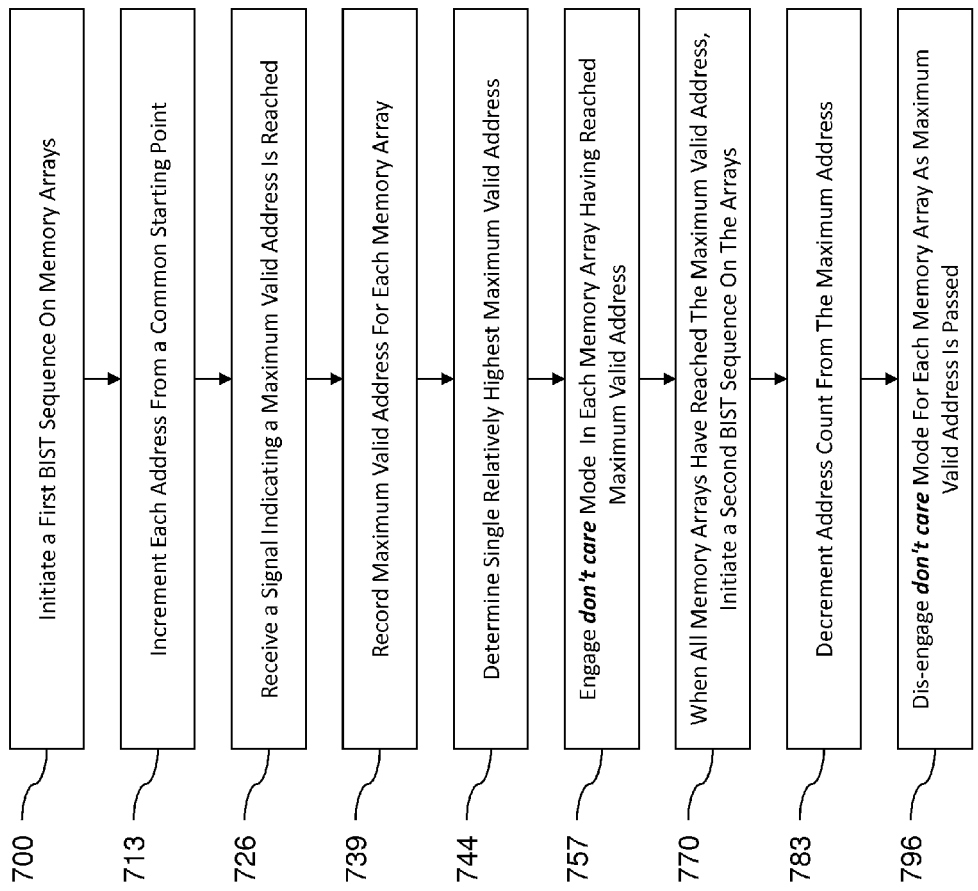
FIG. 7 is a flow diagram illustrating embodiments herein.

FIG. 7 is a flow diagram illustrating the processing flow of an exemplary method of executing a built-in self-test (BIST) operation on a plurality of integrated circuit memory arrays having a common BIST control unit according to embodiments herein. In item 700, a first BIST sequence is initiated on a plurality of integrated circuit memory arrays having a common BIST control unit. At 713, each address for each integrated circuit memory array is incremented in common from a common starting point. A signal is received from each integrated circuit memory array, at 726, indicating a maximum valid address in the integrated circuit memory array is reached. A plurality of maximum valid addresses is received. At 739, the maximum valid addresses are recorded. At 744, a single relatively highest maximum valid address is determined from the plurality of maximum valid addresses. A 'don't care' mode is engaged, at 757, in each integrated circuit memory array having reached the maximum valid address. For example, the 'don't care' mode can be set using at least one bit in the integrated circuit memory array. The 'don't care; mode prevents BIST testing. At 770, a second BIST sequence is initiated on the plurality of integrated circuit memory arrays having the common BIST control unit based on having received the signal from all the integrated circuit memory arrays connected to the common BIST control unit indicating a maximum valid address in the integrated circuit memory array is reached. An address count is decremented from the single relatively highest maximum valid address, at 783. At 796, the 'don't care' mode is disengaged for each integrated circuit memory array as the address count reaches each of the maximum valid addresses of each of the integrated circuit memory arrays during the decrementing.

As will be appreciated by one skilled in the art, aspects of the systems and methods herein may be embodied as a system, method, or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

According to a further embodiment herein, an article of manufacture is provided that includes a tangible computer readable medium having computer readable instructions embodied therein for performing the steps of the computer implemented methods, including but not limited to the method illustrated in FIG. 7. Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a magnetic storage device, a portable compact disc read-only memory (CD-ROM), an optical storage device, a "plug-and-play" memory device, like a USB flash drive, or any suitable combination of the foregoing. In the context of this document, a computer readable storage medium may be any tangible medium that can contain, or store a program for use by or in connection with an instruction execution system, apparatus, or device. Any of these devices may have computer readable instructions for carrying out the steps of the methods described above.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++, or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatus (systems) and computer program products according to embodiments herein. It will be understood that each block of the flowchart illustrations and/or two-dimensional block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions that execute via the processor of the computer or other programmable data processing apparatus create means for implementing the functions/acts specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

In case of implementing the embodiments herein by software and/or firmware, a program constituting the software may be installed into a computer with dedicated hardware, from a storage medium or a network, and the computer is capable of performing various functions if with various programs installed therein.

Figure 8:
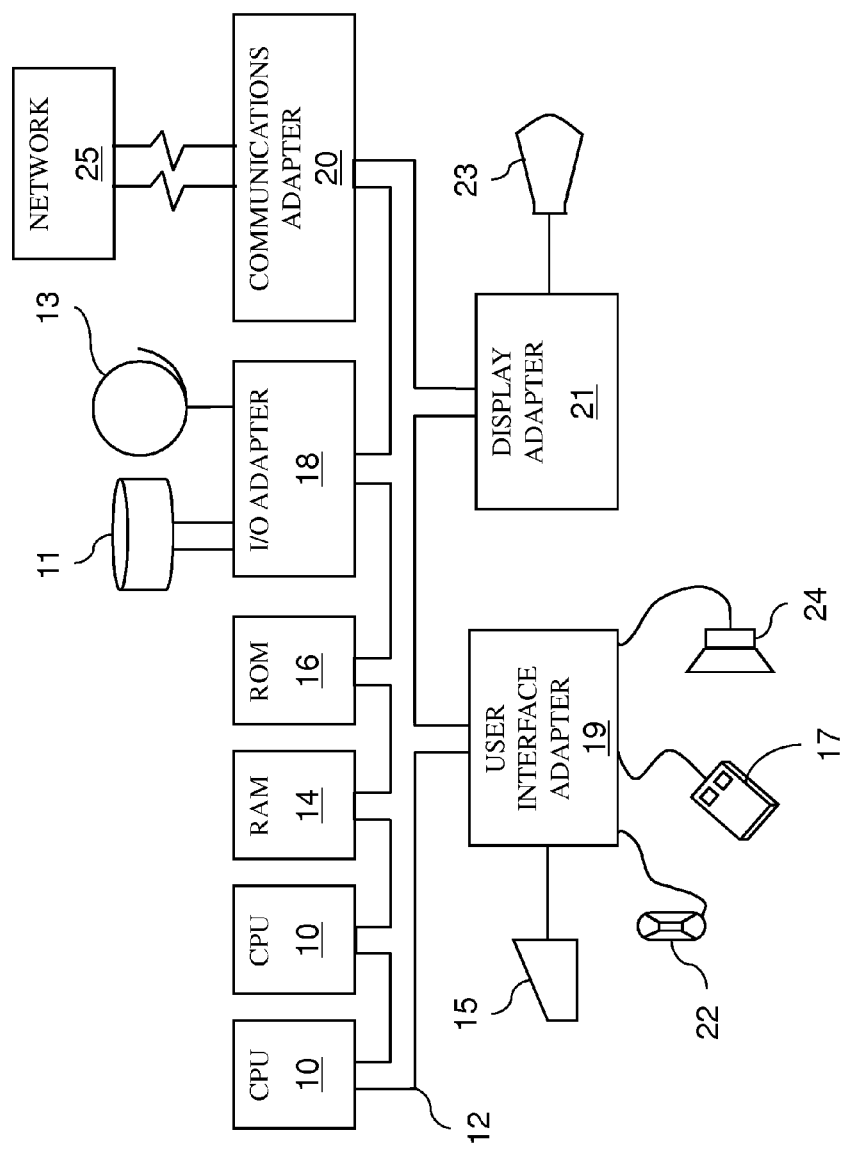
FIG. 8 is a schematic diagram of a hardware system according to embodiments herein.

A representative hardware environment for practicing the embodiments herein is depicted in FIG. 8. This schematic drawing illustrates a hardware configuration of an information handling/computer system in accordance with the embodiments herein. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein.

In FIG. 8, CPUs 10 perform various processing based on a program stored in a Read Only Memory (ROM) 16 or a program loaded from a peripheral device, such as disk units 11 and tape drives 13 to a Random Access Memory (RAM) 14. In the RAM 14, required data when the CPU 10 performs the various processing or the like is also stored as necessary. The CPU 10, the ROM 16, and the RAM 14 are connected to one another via a bus 12. An input/output adapter 18 is also connected to the bus 12 to provide an input/output interface, as necessary. A removable medium, such as a magnetic disk, an optical disk, a magneto-optical disk, a semiconductor memory, or the like, is installed on the peripheral device, as necessary, so that a computer program read therefrom may be installed into the RAM 14, as necessary The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25. The communication adapter 20 performs communication processing via a network such as the Internet. A display adapter 21 connects the bus 12 to a display device 23, which may be embodied as an output device such as a monitor (Cathode Ray Tube (CRT), Liquid Crystal Display (LCD), or the like), printer, or transmitter, for example.

The flowchart and block diagrams in the Figures illustrate the architecture, functionality, and operation of possible implementations of systems, methods, and computer program products according to various embodiments herein. In this regard, each block in the flowchart or block diagrams may represent a module, segment, or portion of code, which comprises one or more executable instructions for implementing the specified logical function(s). It should also be noted that, in some alternative implementations, the functions noted in the block might occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Deployment types include loading directly in the client, server, and proxy computers via loading a storage medium such as a CD, DVD, etc. The process software may also be automatically or semi-automatically deployed into a computer system by sending the process software to a central server or a group of central servers. The process software is then downloaded into the client computers that will execute the process software. The process software is sent directly to the client system via e-mail. The process software is then either detached to a directory or loaded into a directory by a button on the e-mail that executes a program that detaches the process software into a directory. Alternatively, the process software is sent directly to a directory on the client computer hard drive. When there are proxy servers, the process will select the proxy server code, determine on which computers to place the proxy servers' code, transmit the proxy server code, and then install the proxy server code on the proxy computer. The process software will be transmitted to the proxy server, and then stored on the proxy server.

While it is understood that the process software may be deployed by manually loading directly in the client, server, and proxy computers via loading a storage medium such as a CD, DVD, etc., the process software may also be automatically or semi-automatically deployed into a computer system by sending the process software to a central server or a group of central servers. The process software is then downloaded into the client computers that will execute the process software. Alternatively, the process software is sent directly to the client system via e-mail. The process software is then either detached to a directory or loaded into a directory by a button on the e-mail that executes a program that detaches the process software into a directory. Another alternative is to send the process software directly to a directory on the client computer hard drive. When there are proxy servers, the process will select the proxy server code, determine on which computers to place the proxy servers' code, transmit the proxy server code, and then install the proxy server code on the proxy computer. The process software will be transmitted to the proxy server, and then stored on the proxy server.

Figure 9:
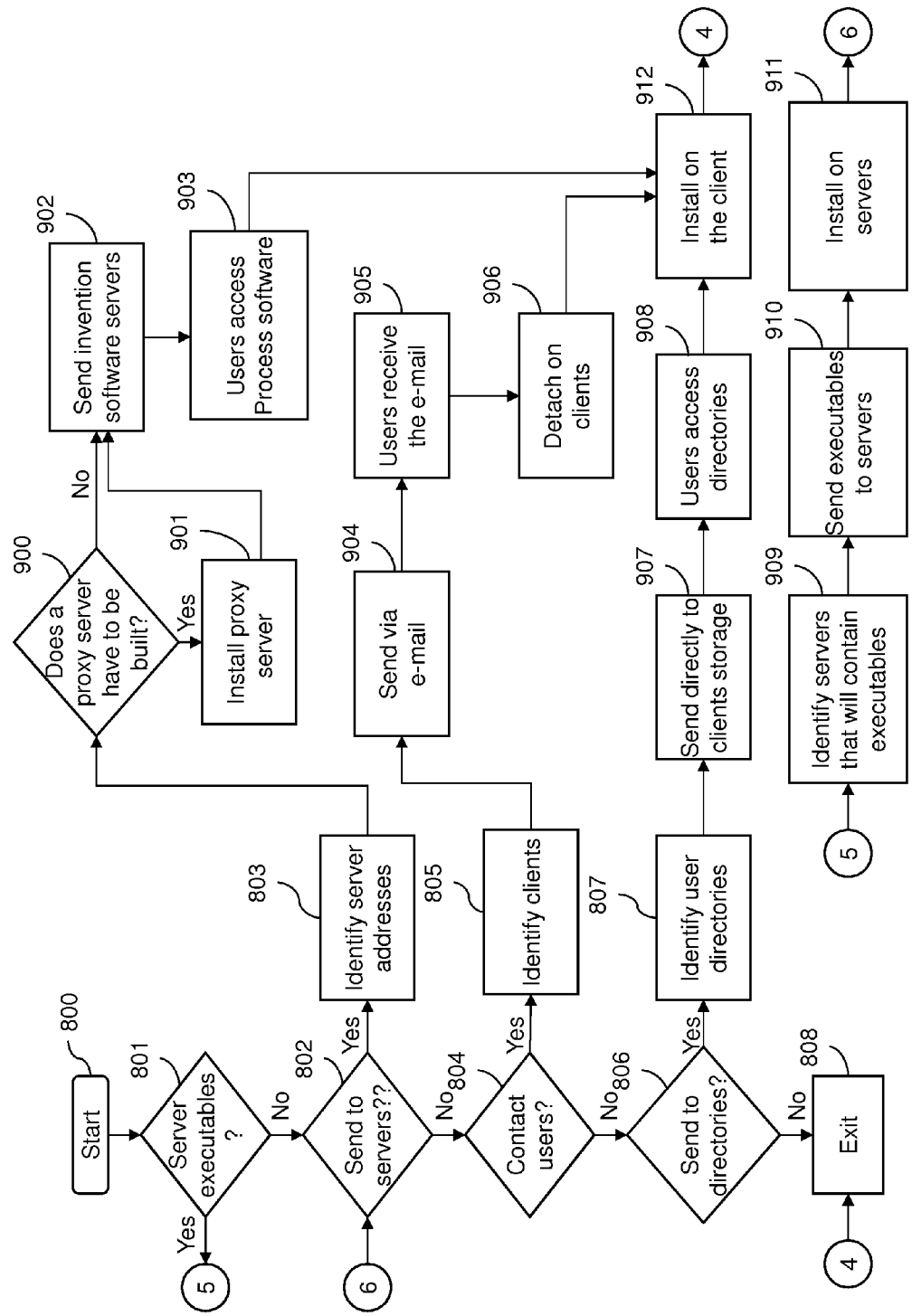
FIG. 9 is a schematic diagram of a deployment system according to embodiments herein.

In FIG. 9, step 800 begins the deployment of the process software. The first thing is to determine if there are any programs that will reside on a server or servers when the process software is executed 801. If this is the case, then the servers that will contain the executables are identified 909. The process software for the server or servers is transferred directly to the servers' storage via FTP or some other protocol, or by copying through the use of a shared file system 910. The process software is then installed on the servers 911.

Next, a determination is made on whether the process software is to be deployed by having users access the process software on a server or servers 802. If the users are to access the process software on servers, then the server addresses that will store the process software are identified 803.

A determination is made if a proxy server is to be built 900 to store the process software. A proxy server is a server that sits between a client application, such as a Web browser, and a real server. It intercepts all requests to the real server to see if it can fulfill the requests itself. If not, it forwards the request to the real server. The two primary benefits of a proxy server are to improve performance and to filter requests. If a proxy server is required, then the proxy server is installed 901. The process software is either sent to the servers via a protocol such as FTP or it is copied directly from the source files to the server files via file sharing 902. Another embodiment would be to send a transaction to the servers that contain the process software and have the server process the transaction, then receive and copy the process software to the server's file system. Once the process software is stored at the servers, the users, via their client computers, then access the process software on the servers and copy it to their client computers file systems 903. Another embodiment is to have the servers automatically copy the process software to each client and then run the installation program for the process software at each client computer. The users execute the program that installs the process software on their client computer 912, and then exit the process 808.

In step 804, a determination is made whether the process software is to be deployed by sending the process software to users via e-mail. The set of users where the process software will be deployed are identified together with the addresses of the user client computers 805. The process software is sent via e-mail 904 to each of the users' client computers. The users receive the e-mail 905 and then detach the process software from the e-mail to a directory on their client computers 906. The users execute the program that installs the process software on their client computer 912, and then exit the process 808.

Lastly, a determination is made on whether the process software will be sent directly to user directories on their client computers 806. If so, the user directories are identified 807. The process software is transferred directly to the users' client computer directory 907. This can be done in several ways such as but not limited to sharing of the file system directories and then copying from the sender's file system to the recipient users' file system or alternatively using a transfer protocol such as File Transfer Protocol (FTP). The users access the directories on their client file systems in preparation for installing the process software 908. The users execute the program that installs the process software on their client computer 912, and then exit the process 808.

The process software is integrated into a client, server, and network environment by providing for the process software to coexist with applications, operating systems, and network operating systems software, and then installing the process software on the clients and servers in the environment where the process software will function.

The first step is to identify any software on the clients and servers including the network operating system where the process software will be deployed that are required by the process software or that work in conjunction with the process software. This includes the network operating system that is software that enhances a basic operating system by adding networking features.

Next, the software applications and version numbers will be identified and compared to the list of software applications and version numbers that have been tested to work with the process software. Those software applications that are missing or that do not match the correct version will be upgraded with the correct version numbers. Program instructions that pass parameters from the process software to the software applications will be checked to ensure the parameter lists match the parameter lists required by the process software. Conversely, parameters passed by the software applications to the process software will be checked to ensure the parameters match the parameters required by the process software. The client and server operating systems including the network operating systems will be identified and compared to the list of operating systems, version numbers, and network software that have been tested to work with the process software. Those operating systems, version numbers, and network software that do not match the list of tested operating systems and version numbers will be upgraded on the clients and servers to the required level.

After ensuring that the software, where the process software is to be deployed, is at the correct version level that has been tested to work with the process software, the integration is completed by installing the process software on the clients and servers.

Figure 10:
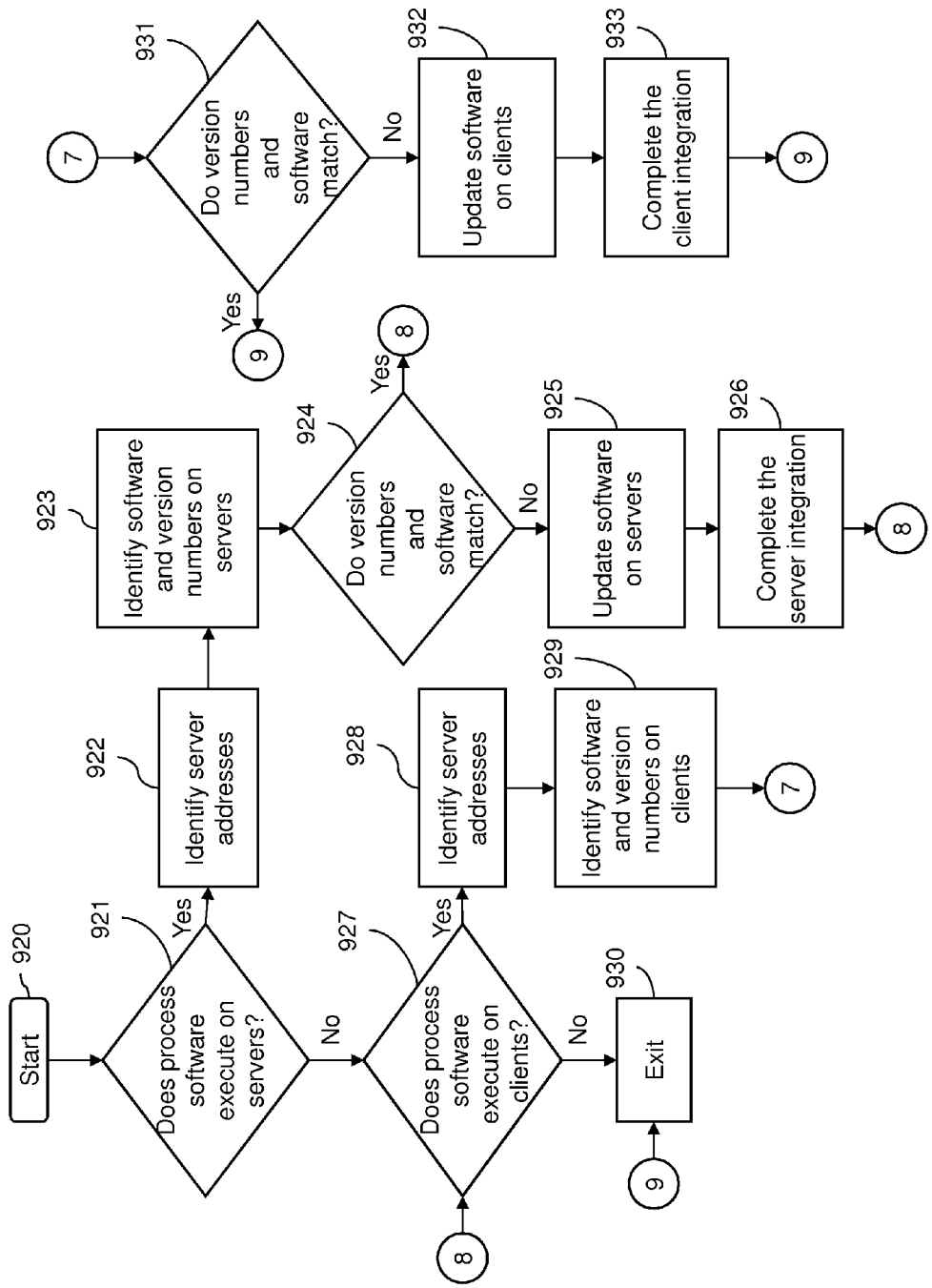
FIG. 10 is a schematic diagram of an integration system according to embodiments herein.

In FIG. 10, step 920 begins the integration of the process software. The first thing is to determine if there are any process software programs that will execute on a server or servers 921. If this is not the case, then integration proceeds to 927. If this is the case, then the server addresses are identified 922. The servers are checked to see if they contain software that includes the operating system (OS), applications, and network operating systems (NOS), together with their version numbers, which have been tested with the process software

923. The servers are also checked to determine if there is any missing software that is required by the process software 923.

A determination is made if the version numbers match the version numbers of OS, applications, and NOS that have been tested with the process software 924. If all of the versions match and there is no missing required software, the integration continues in 927.

If one or more of the version numbers do not match, then the unmatched versions are updated on the server or servers with the correct versions 925. Additionally, if there is missing required software, then it is updated on the server or servers 925. The server integration is completed by installing the process software 926.

Step 927, which follows either step 921, 924, or 926, determines if there are any programs of the process software that will execute on the clients. If no process software programs execute on the clients, the integration proceeds to 930 and exits. If this not the case, then the client addresses are identified 928.

The clients are checked to see if they contain software that includes the operating system (OS), applications, and network operating systems (NOS), together with their version numbers, which have been tested with the process software 929. The clients are also checked to determine if there is any missing software that is required by the process software 929.

A determination is made as to whether the version numbers match the version numbers of OS, applications, and NOS that have been tested with the process software 931. If all of the versions match and there is no missing required software, then the integration proceeds to 930 and exits.

If one or more of the version numbers do not match, then the unmatched versions are updated on the clients with the correct versions 932. In addition, if there is missing required software then it is updated on the clients 932. The client integration is completed by installing the process software on the clients 933. The integration proceeds to 930 and exits.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally, the assessed server may make requests of other servers that require CPU units. CPU units are an example that represents one measurement of use. Other measurements of use include but are not limited to network bandwidth, memory usage, storage usage, packet transfers, complete transactions etc. When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to affect the performance of that server, other servers are accessed to increase the capacity and to share the workload. Likewise, when other measurements of use such as network bandwidth, memory usage, storage usage, etc. approach a capacity so as to affect performance, additional network bandwidth, memory usage, storage etc. are added to share the workload. The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and/or indicated on a web site accessed by the customer, which then remits payment to the service provider. In another embodiment, the service provider requests payment directly from a customer account at a banking or financial institution. In another embodiment, if the service provider is also a customer of the customer that uses the process software application, the payment owed to the service provider is reconciled to the payment owed by the service provider to minimize the transfer of payments.

The process software is shared, simultaneously serving multiple customers in a flexible, automated fashion. It is standardized, requiring little customization, and it is scalable, providing capacity on demand in a pay-as-you-go model.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally, the assessed server may make requests of other servers that require CPU units. CPU units are an example that represents one measurement of use. Other measurements of use include but are not limited to network bandwidth, memory usage, storage usage, packet transfers, complete transactions etc.

When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to affect the performance of that server, other servers are accessed to increase the capacity and to share the workload. Likewise, when other measurements of use such as network bandwidth, memory usage, storage usage, etc. approach a capacity so as to affect performance, additional network bandwidth, memory usage, storage etc. are added to share the workload.

The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and/or indicated on a web site accessed by the customer, which then remits payment to the service provider.

In another embodiment, the service provider requests payment directly from a customer account at a banking or financial institution.

In another embodiment, if the service provider is also a customer of the customer that uses the process software application, the payment owed to the service provider is reconciled to the payment owed by the service provider to minimize the transfer of payments.

Figure 11:
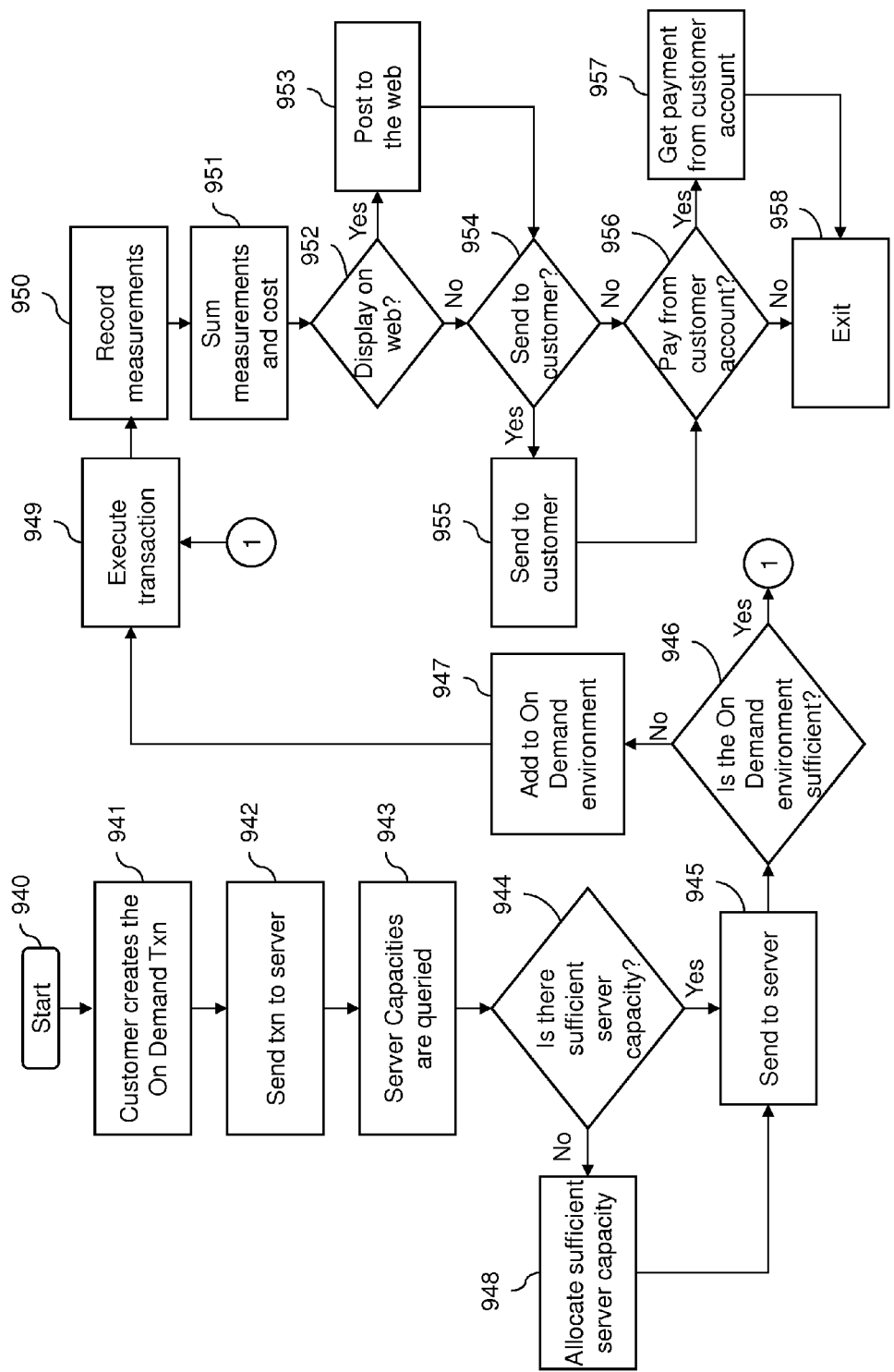
FIG. 11 is a schematic diagram of an on demand system according to embodiments herein.

In FIG. 11, step 940 begins the On Demand process. A transaction is created that contains the unique customer identification, the requested service type, and any service parameters that further specify the type of service 941. The transaction is then sent to the main server 942. In an On Demand environment, the main server can initially be the only server, then, as capacity is consumed, other servers are added to the On Demand environment.

The server central processing unit (CPU) capacities in the On Demand environment are queried 943. The CPU requirement of the transaction is estimated, then the servers' available CPU capacity in the On Demand environment are compared to the transaction CPU requirement to see if there is sufficient CPU capacity available in any server to process the transaction 944. If there is not sufficient server CPU capacity available, then additional server CPU capacity is allocated to process the transaction 948. If there was already sufficient CPU capacity available, then the transaction is sent to a selected server 945.

Before executing the transaction, a check is made of the remaining On Demand environment to determine if the environment has sufficient available capacity for processing the transaction. This environment capacity consists of such things as, but not limited to, network bandwidth, processor memory, storage etc. 946. If there is not sufficient available capacity, then capacity will be added to the On Demand environment 947. Next, the required software to process the transaction is accessed, loaded into memory, then the transaction is executed 949.

The usage measurements are recorded 950. The usage measurements consist of the portions of those functions in the On Demand environment that are used to process the transaction. The usage of such functions as, but not limited to, network bandwidth, processor memory, storage and CPU cycles are what is recorded. The usage measurements are summed, multiplied by unit costs, and then recorded as a charge to the requesting customer 951. If the customer has requested that the On Demand costs be posted to a web site 952, then they are posted 953.

If the customer has requested that the On Demand costs be sent via e-mail to a customer address 954, then they are sent 955. If the customer has requested that the On Demand costs be paid directly from a customer account 956, then payment is received directly from the customer account 957. The last step is to exit the On Demand process 958.

The process software may be deployed, accessed and executed through the use of a virtual private network (VPN), which is any combination of technologies that can be used to secure a connection through an otherwise unsecured or untrusted network. The use of VPNs is to improve security and for reduced operational costs. The VPN makes use of a public network, usually the Internet, to connect remote sites or users together. Instead of using a dedicated, real-world connection such as leased line, the VPN uses "virtual" connections routed through the Internet from the company's private network to the remote site or employee.

The process software may be deployed, accessed, and executed through either a remote-access or a site-to-site VPN. When using the remote-access VPNs, the process software is deployed, accessed, and executed via the secure, encrypted connections between a company's private network and remote users through a third-party service provider. The enterprise service provider (ESP) sets a network access server (NAS) and provides the remote users with desktop client software for their computers. The telecommuters can then dial a toll-free number or attach directly via a cable or DSL modem to reach the NAS and use their VPN client software to access the corporate network and to access, download, and execute the process software.

When using the site-to-site VPN, the process software is deployed, accessed, and executed through the use of dedicated equipment and large-scale encryption, which are used to connect a company's multiple fixed sites over a public network, such as the Internet.

The process software is transported over the VPN via tunneling, which is the process of placing an entire packet within another packet and sending it over a network. The protocol of the outer packet is understood by the network and both points, called tunnel interfaces, where the packet enters and exits the network.

Figure 12:
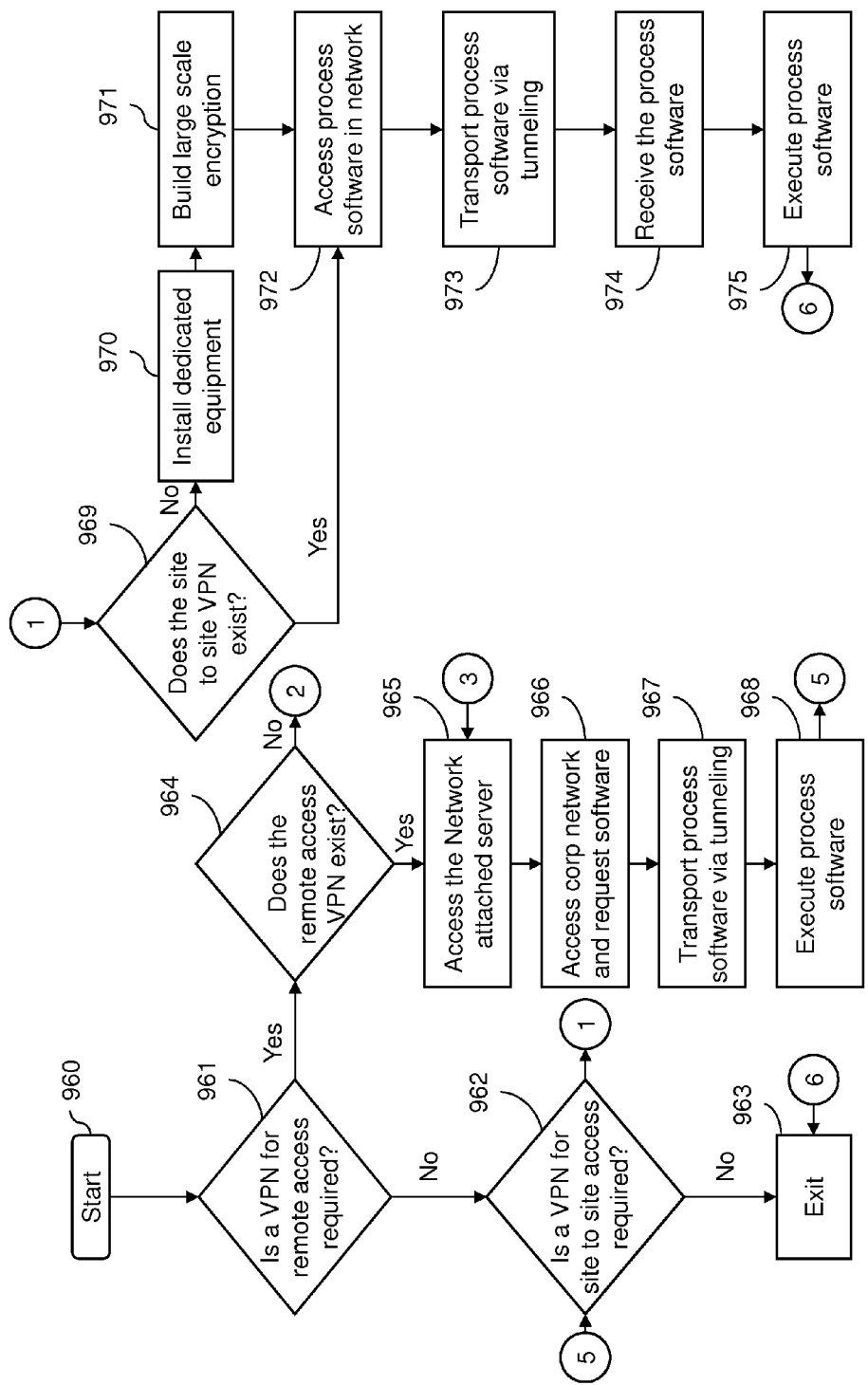
FIG. 12 is a schematic diagram of a virtual private network system according to embodiments herein.
Figure 13:
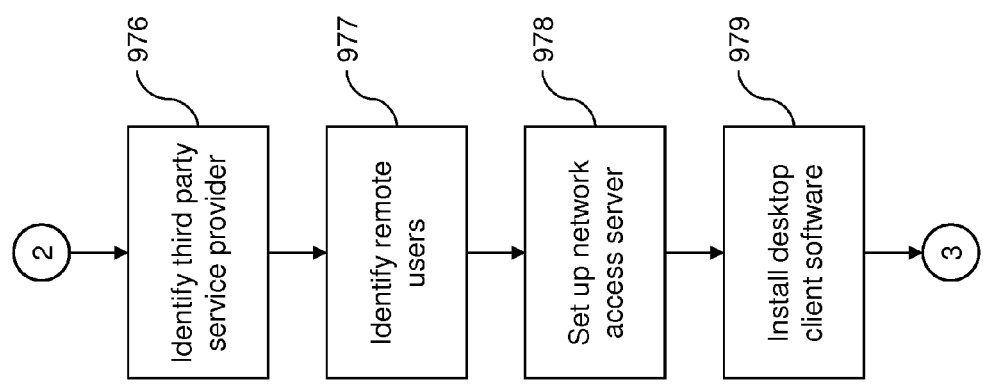
FIG. 13 is a schematic diagram of a virtual private network system according to embodiments herein.

In FIGS. 12 and 13, step 960 begins the Virtual Private Network (VPN) process. A determination is made to see if a VPN for remote access is required 961. If it is not required, then proceed to 962. If it is required, then determine if the remote access VPN exists 964.

If it does exist, then proceed to 965. Otherwise, identify the third party provider that will provide the secure, encrypted connections between the company's private network and the company's remote users 976. The company's remote users are identified 977. The third party provider then sets up a network access server (NAS) 978 that allows the remote users to dial a toll-free number or attach directly via a cable or DSL modem to access, download, and install the desktop client software for the remote-access VPN 979.

After the remote access VPN has been built, or if it been previously installed, the remote users can then access the process software by dialing into the NAS or attaching directly via a cable or DSL modem into the NAS 965. This allows entry into the corporate network where the process software is accessed 966. The process software is transported to the remote users' desktop over the network via tunneling. That is, the process software is divided into packets and each packet, including the data and protocol, is placed within another packet 967. When the process software arrives at the remote users' desktop, it is removed from the packets, reconstituted, and executed on the remote users' desktop 968.

A determination is made to see if a VPN for site-to-site access is required 962. If it is not required, then proceed to exit the process 963. Otherwise, determine if the site-to-site VPN exists 969. If it does exist, then proceed to 972. Otherwise, install the dedicated equipment required to establish a site-to-site VPN 970. Then build the large-scale encryption into the VPN 971.

After the site-to-site VPN has been built, or if it had been previously established, the users access the process software via the VPN 972. The process software is transported to the site users over the network via tunneling 973. That is, the process software is divided into packets and each packet, including the data and protocol, is placed within another packet 974. When the process software arrives at the remote users' desktop, it is removed from the packets, reconstituted, and executed on the site users' desktop 975. Proceed to exit the process 963.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments herein have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   initiating a first built-in self-test (BIST) sequence on a plurality of integrated circuit memory arrays having a common BIST control unit;
   incrementing each address for each said integrated circuit memory array in common from a common starting point, using said common BIST control unit;
   receiving, by said common BIST control unit from each said integrated circuit memory array, a signal indicating a maximum valid address in said integrated circuit memory array is reached, to receive a plurality of maximum valid addresses;
   recording, in said common BIST control unit, said maximum valid addresses;
   determining a single relatively highest maximum valid address from said plurality of maximum valid addresses, using said common BIST control unit;
   engaging, by said common BIST control unit, a first mode in each said integrated circuit memory array having reached said maximum valid address, said first mode preventing BIST testing;
   initiating a second BIST sequence from said common BIST control unit on said plurality of integrated circuit memory arrays having said common BIST control unit, based on said common BIST control unit having received said signal indicating a maximum valid address in said integrated circuit memory array is reached from all said integrated circuit memory arrays connected to said common BIST control unit;
   decrementing an address count from said single relatively highest maximum valid address, using said common BIST control unit; and
   disengaging, by said common BIST control unit, said first mode for each said integrated circuit memory array as said address count reaches each of said maximum valid addresses of each of said integrated circuit memory arrays during said decrementing.

2. The method according to claim 1, said first BIST sequence comprising read operations and write operations.

3. The method according to claim 1, said second BIST sequence comprising read operations and write operations.

4. The method according to claim 1, said engaging a first mode in each said integrated circuit memory array having reached said maximum valid address comprising setting at least one bit in said integrated circuit memory array to reflect a 'don't care' mode.

5. The method according to claim 1, said integrated circuit memory arrays comprising out of bounds detection logic providing said signal indicating a maximum valid address in said integrated circuit memory array is reached to said BIST control unit.

6. The method according to claim 1, said BIST control unit comprising a summation circuit receiving out of bounds signals from said integrated circuit memory arrays.

7. A computer implemented method of executing a built-in self-test (BIST) operation on a plurality of integrated circuit memory arrays having a common BIST control unit, said method comprising:

initiating a first BIST sequence on said plurality of integrated circuit memory arrays, using a computerized device;
starting from a common starting point, automatically incrementing each address for each said integrated circuit memory array in common from said common starting point, using said computerized device;
receiving, by said computerized device from each said integrated circuit memory array, a signal indicating a maximum valid address has been reached, said computerized device receiving a plurality of maximum valid addresses;
recording said maximum valid address for each of said integrated circuit memory arrays, using said computerized device;
determining a single relatively highest maximum valid address from said plurality of maximum valid addresses, using said computerized device;
engaging a first mode in each said integrated circuit memory array having reached said maximum valid address, using said computerized device, said first mode preventing BIST testing;
initiating a second BIST sequence on said plurality of integrated circuit memory arrays based on said signal indicating said maximum valid address in said integrated circuit memory array having been received from all said integrated circuit memory arrays connected to said common BIST control unit, using said computerized device;
decrementing, starting from said single relatively highest maximum valid address, an address count for each said integrated circuit memory array, using said computerized device; and
disengaging said first mode for each said integrated circuit memory array as said address count passes said maximum valid address associated with each said integrated circuit memory array during said decrementing, using said computerized device.

8. The computer implemented method according to claim 7, said first BIST sequence comprising read operations and write operations.

9. The computer implemented method according to claim 7, said second BIST sequence comprising read operations and write operations.

10. The computer implemented method according to claim 7, said engaging a first mode in each said integrated circuit memory array having reached said maximum valid address comprising setting at least one bit in said integrated circuit memory array to reflect a 'don't care' mode.

11. The computer implemented method according to claim 7, said integrated circuit memory arrays comprising out of bounds detection logic providing said signal indicating a maximum valid address in said integrated circuit memory array is reached to said BIST control unit.

12. The computer implemented method according to claim 7, said BIST control unit comprising a summation circuit receiving out of bounds signals from said integrated circuit memory arrays.

13. The computer implemented method according to claim 12, said summation circuit determining that said maximum valid address in said integrated circuit memory array having been received from all said integrated circuit memory arrays connected to said common BIST control unit.

14. An apparatus for executing a built-in self-test (BIST) on integrated circuit memory arrays, comprising:

a BIST Engine comprising:
  a test pattern generator;
  an address counter;
  a control unit; and
  a plurality of memory storage elements,
said control unit being operatively coupled to a plurality of integrated circuit memory arrays, each said integrated circuit memory array comprising:
  sensing logic for comparing a received address to a maximum valid address for said integrated circuit memory array; and
  a signal generator generating a signal based on said maximum valid address being reached,
said control unit generating and transmitting a first test pattern to each said integrated circuit memory array,
said control unit sequentially incrementing or decrementing said address counter, generating and transmitting another test pattern to each said integrated circuit memory array,
said control unit receiving said signal indicating said maximum valid address has been reached for each said integrated circuit memory array,
said control unit storing said maximum valid address for each of said integrated circuit memory arrays in one of said plurality of memory storage elements, and
said control unit determining all said integrated circuit memory arrays have indicated that said maximum valid address has been reached.

15. The apparatus according to claim 14, said control unit further comprising a summation circuit receiving out of bounds signals from said integrated circuit memory arrays.

16. The apparatus according to claim 15, said summation circuit determining that said maximum valid address has been reached for each said integrated circuit memory array.

17. The apparatus according to claim 14, said control unit setting at least one bit in each said integrated circuit memory array to reflect a 'don't care' mode based on said receiving said signal indicating said maximum valid address has been reached for each said integrated circuit memory array.

18. The apparatus according to claim 14, said sensing logic comprising out of bounds detection logic providing said signal indicating a maximum valid address in said integrated circuit memory array is reached to said control unit.

19. The apparatus according to claim 14, said BIST Engine further comprising a response analyzer.

20. A computer program product for executing a built-in self-test (BIST) operation, said computer program product comprising a non-transitory computer readable storage medium having program code embodied therewith, the program code being readable and executable by a computer to perform a method comprising:

initiating a first built-in self-test (BIST) sequence on a plurality of integrated circuit memory arrays having a common BIST control unit;
  incrementing each address for each said integrated circuit memory array in common from a common starting point;
  receiving from each said integrated circuit memory array a signal indicating a maximum valid address in said integrated circuit memory array is reached to receive a plurality of maximum valid addresses;
  recording said maximum valid addresses;
  determining a single relatively highest maximum valid address from said maximum valid addresses;
  engaging a first mode in each said integrated circuit memory array having reached said maximum valid address, said first mode preventing BIST testing;
  initiating a second BIST sequence on said plurality of integrated circuit memory arrays having said common BIST control unit, based on having received said signal indicating a maximum valid address in said integrated circuit memory array is reached from all said integrated circuit memory arrays connected to said common BIST control unit;
  decrementing an address count from said single relatively highest maximum valid address; and
  disengaging said first mode for each said integrated circuit memory array as said address count reaches each of said maximum valid addresses of each of said integrated circuit memory arrays during said decrementing.

21. The computer program product according to claim 20, said first BIST sequence comprising read operations and write operations.

22. The computer program product according to claim 20, said second BIST sequence comprising read operations and write operations.

23. The computer program product according to claim 20, said engaging a first mode in each said integrated circuit memory array having reached said maximum valid address comprising setting at least one bit in said integrated circuit memory array to reflect a 'don't care' mode.

24. The computer program product according to claim 20, said integrated circuit memory arrays comprising out of bounds detection logic providing said signal indicating a maximum valid address in said integrated circuit memory array is reached to said BIST control unit.

25. The computer program product according to claim 20, said BIST control unit comprising a summation circuit receiving out of bounds signals from said integrated circuit memory arrays.

* * * * *